(12) United States Patent
Farnholtz

(10) Patent No.: US 8,780,551 B2
(45) Date of Patent: Jul. 15, 2014

(54) BLADE AND AIR DEFLECTOR IN A PLENUM

(75) Inventor: Eric W. Farnholtz, Alamo, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 151 days.

(21) Appl. No.: 13/363,306

(22) Filed: Jan. 31, 2012

(65) Prior Publication Data
US 2013/0163190 A1    Jun. 27, 2013

Related U.S. Application Data

(60) Provisional application No. 61/578,767, filed on Dec. 21, 2011.

(51) Int. Cl.
*H05K 7/20* (2006.01)
*G06F 1/20* (2006.01)

(52) U.S. Cl.
USPC .............. 361/679.49; 361/679.48; 361/679.5; 361/679.51; 361/695; 361/788; 361/721

(58) Field of Classification Search
USPC ........ 361/679.48–679.51, 694–695, 788, 721
See application file for complete search history.

(56) References Cited

U.S. PATENT DOCUMENTS

| | | | |
|---|---|---|---|
| 7,173,817 B2 * | 2/2007 | Wei ........................... | 361/679.48 |
| 7,259,961 B2 * | 8/2007 | Lucero et al. ................. | 361/695 |
| 7,355,850 B2 * | 4/2008 | Baldwin, Jr. .................. | 361/695 |
| 7,394,654 B2 * | 7/2008 | Zieman et al. ................. | 361/695 |
| 7,813,121 B2 * | 10/2010 | Bisson et al. ............. | 361/679.51 |
| 7,957,133 B2 * | 6/2011 | Zieman et al. ............ | 361/679.51 |
| 8,154,867 B2 * | 4/2012 | Shearman et al. ......... | 361/679.5 |
| 8,208,253 B1 * | 6/2012 | Goergen et al. ............ | 361/679.5 |
| 8,320,121 B2 * | 11/2012 | Bisson et al. ............ | 361/679.51 |
| 8,446,725 B2 * | 5/2013 | Lam et al. ...................... | 361/695 |
| 2009/0097204 A1 * | 4/2009 | Byers ............................ | 361/695 |
| 2009/0109619 A1 * | 4/2009 | Wise et al. .................... | 361/695 |

FOREIGN PATENT DOCUMENTS

DE    4128047 A1 *    2/1993    ............... H05K 7/20

* cited by examiner

*Primary Examiner* — Robert J Hoffberg
(74) *Attorney, Agent, or Firm* — Bever, Hoffman & Harms, LLP; E. Eric Hoffman

(57) ABSTRACT

A chassis-based processing system includes a first set of processing blades mounted in parallel within a card cage and attached to a backplane within a chassis. An air intake plenum allows air to flow into the chassis, and over the first set of processing blades in an optimized manner. A separate processing blade is located in the air intake plenum, and is attached to the backplane. This processing blade may have less restrictive proximity requirements than the first set of processing blades. The processing blade in the plenum is positioned perpendicular to the first set of processing blades. As a result, airflow over the processing blade in the plenum has a different orientation than airflow over the first set of processing blades. An air deflector structure in the plenum deflects some of the air flowing into the plenum onto the processing blade located in the plenum, thereby providing improved cooling.

27 Claims, 5 Drawing Sheets

BLADE AND AIR DEFLECTOR IN A PLENUM

RELATED APPLICATIONS

This application claims priority from U.S. Provisional Patent Application 61/578,767, entitled "Blade And Air Deflector In A Plenum", which was filed on Dec. 21, 2011, and is incorporated by reference herein.

FIELD OF THE INVENTION

The present invention relates to a chassis-based processing system that includes associated processing blades that must be cooled.

RELATED ART

FIG. 1A is an isometric drawing that represents a conventional chassis-based processing system 100. FIG. 1B is a side view of chassis-based processing system 100. Chassis-based processing system 100 includes power supply system 101, air intake plenum 102, card cage 103, backplane 104, exhaust fan 105, processing blades 111-119 and chassis 150. Blades 111-119 are inserted into slots within card cage 103, whereby card cage 103 provides physical support for blades 111-119. Connector elements, such as connector element 125 (FIG. 1B), provide electrical connections between the backplane 104 and blades 111-119. Processing blades 111-119 include electrical components, such as electrical components 121-124 (FIG. 1B), which perform functions such as switching, management functions or computational functions. Power supply system 101 supplies power to processing blades 111-119 through backplane 104.

The cooling of blades 111-119 is important and requires air movers and plenums to direct airflow for cooling. Thus, fan 105 is mounted over an opening on the rear of the chassis 150. When fan 105 is turned on, airflow 130 is created, whereby air flows into the intake plenum 102, upward over processing blades 111-119 (and components 121-124), over the backplane 104 and out through the rear (exhaust plenum) of the chassis 150. The airflow 130 proceeds across processing blades 111-119 in a direction that is substantially parallel to the backplane 104. This airflow configuration is optimal for cooling processing blades 111-119.

The number of blades in chassis-based processing system 100 is limited in part by the width of the chassis 150 and the need for those blades to be in close proximity to each other due to signaling and other concerns. The chassis-based processing system 100 illustrated by FIGS. 1A-1B includes eight full length blades 111-118 and a set of six half-length blades 119, which are cooled by the airflow 130 created by fan 105. It would be desirable to have a method and structure that enables additional blades to be included within chassis-based processing system 100, without significantly increasing the size of chassis 150, while meeting the proximity requirements of the various blades, and providing the capability of adequately cooling these additional blades.

SUMMARY

Accordingly, the present invention provides a chassis-based processing system that locates a processing blade in an intake plenum of the system. The processing blade located in the intake plenum is selected in view of the proximity requirements of this blade. More specifically, the processing blade located in the intake plenum has less restrictive proximity requirements than processing blades that are not located within the intake plenum. Locating a processing blade in the intake plenum advantageously frees up a blade location within the card cage, thereby enabling an additional processing blade to be located within the chassis, without increasing the size of the chassis.

In accordance with another embodiment, an air deflector structure is located in the intake plenum. This air deflector structure includes air deflectors that direct air within the intake plenum to flow onto components of the processing blade located in the intake plenum. As a result, the processing blade in the intake plenum is adequately cooled.

The present invention will be more fully understood in view of the following description and drawings.

DETAILED DESCRIPTION

Figure 1A:
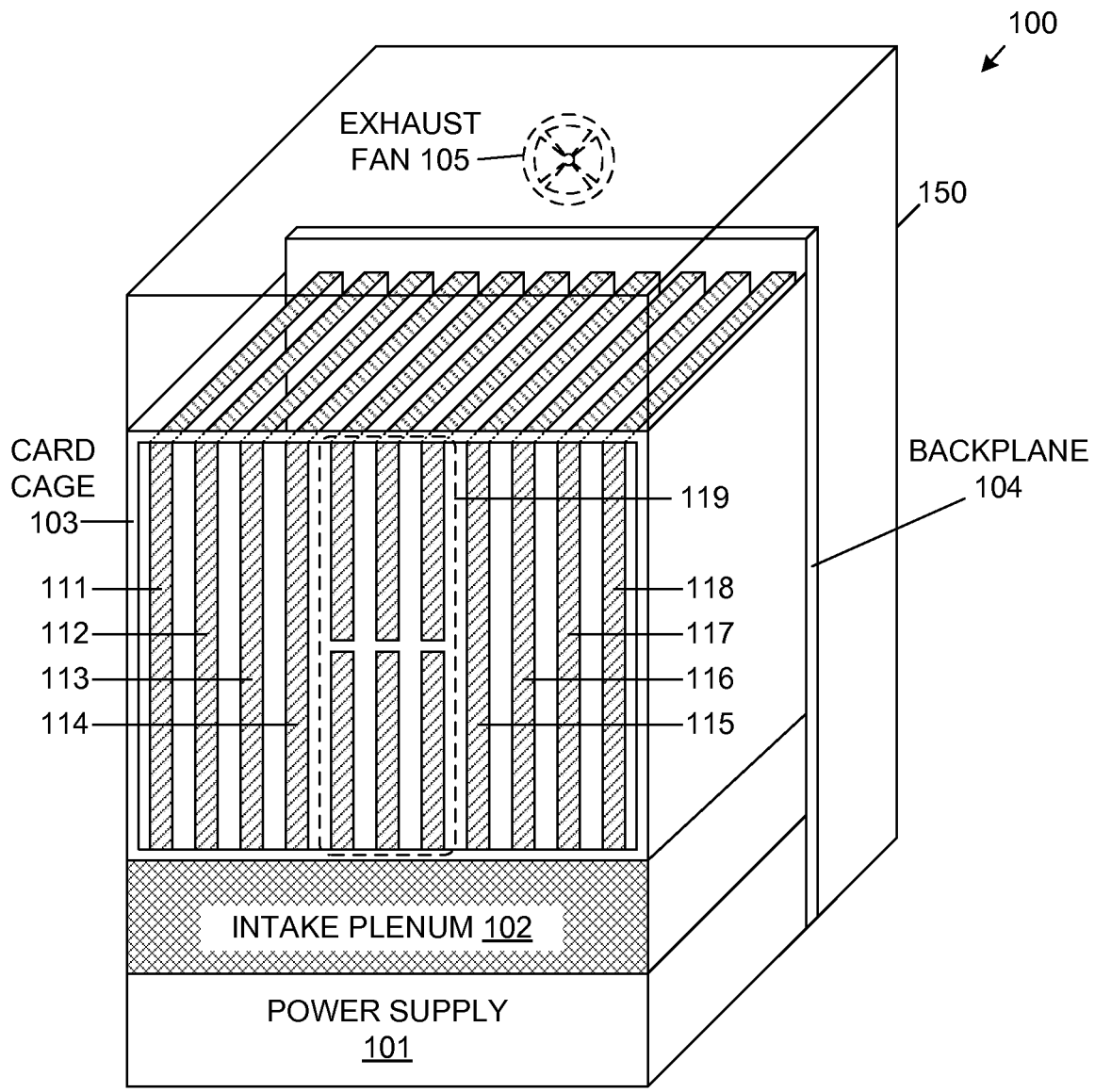
FIG. 1A is an isometric drawing of a conventional chassis-based processing system.
Figure 1B:
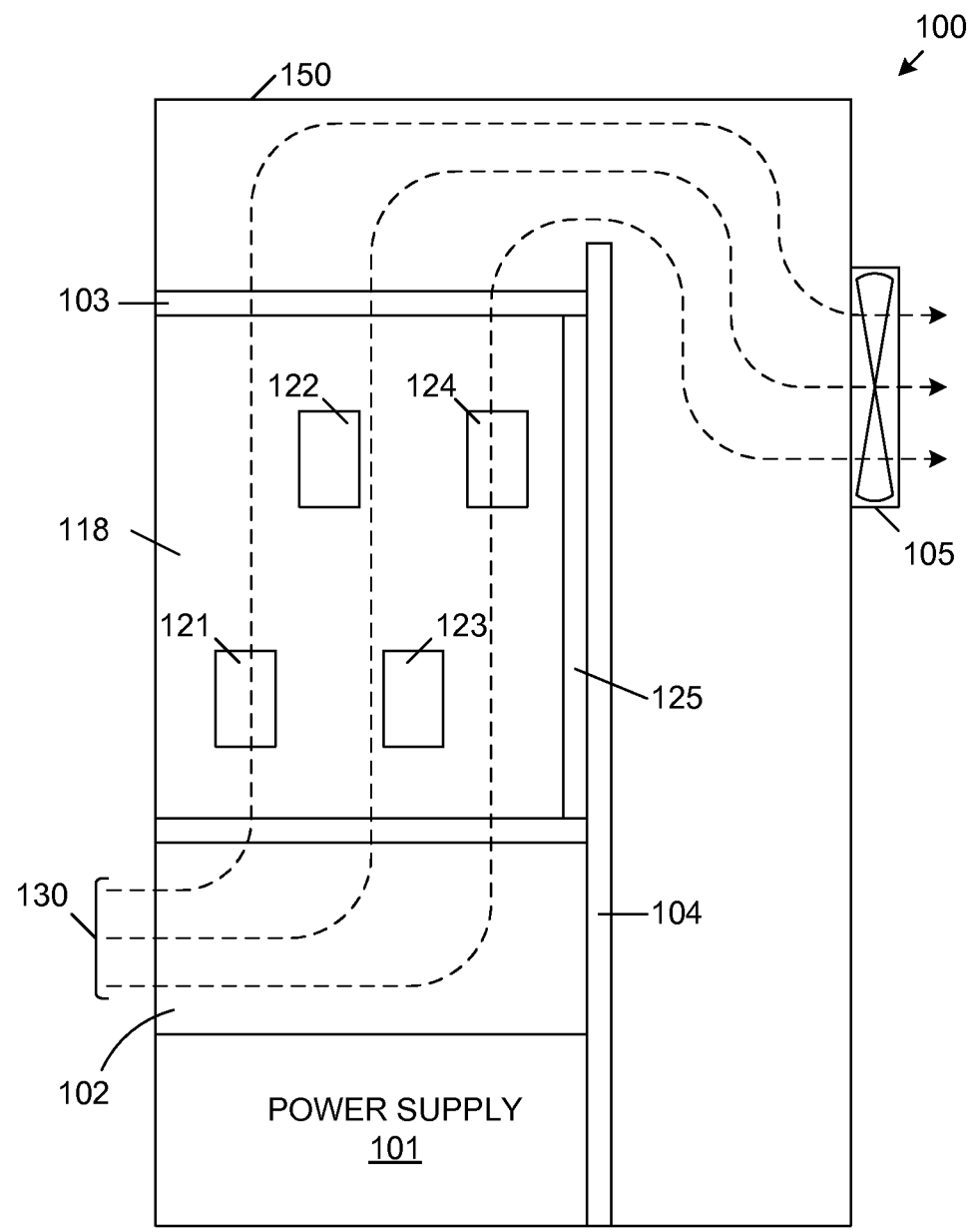
FIG. 1B is a side view of the conventional chassis-based processing system of FIG. 1A.
Figure 2A:
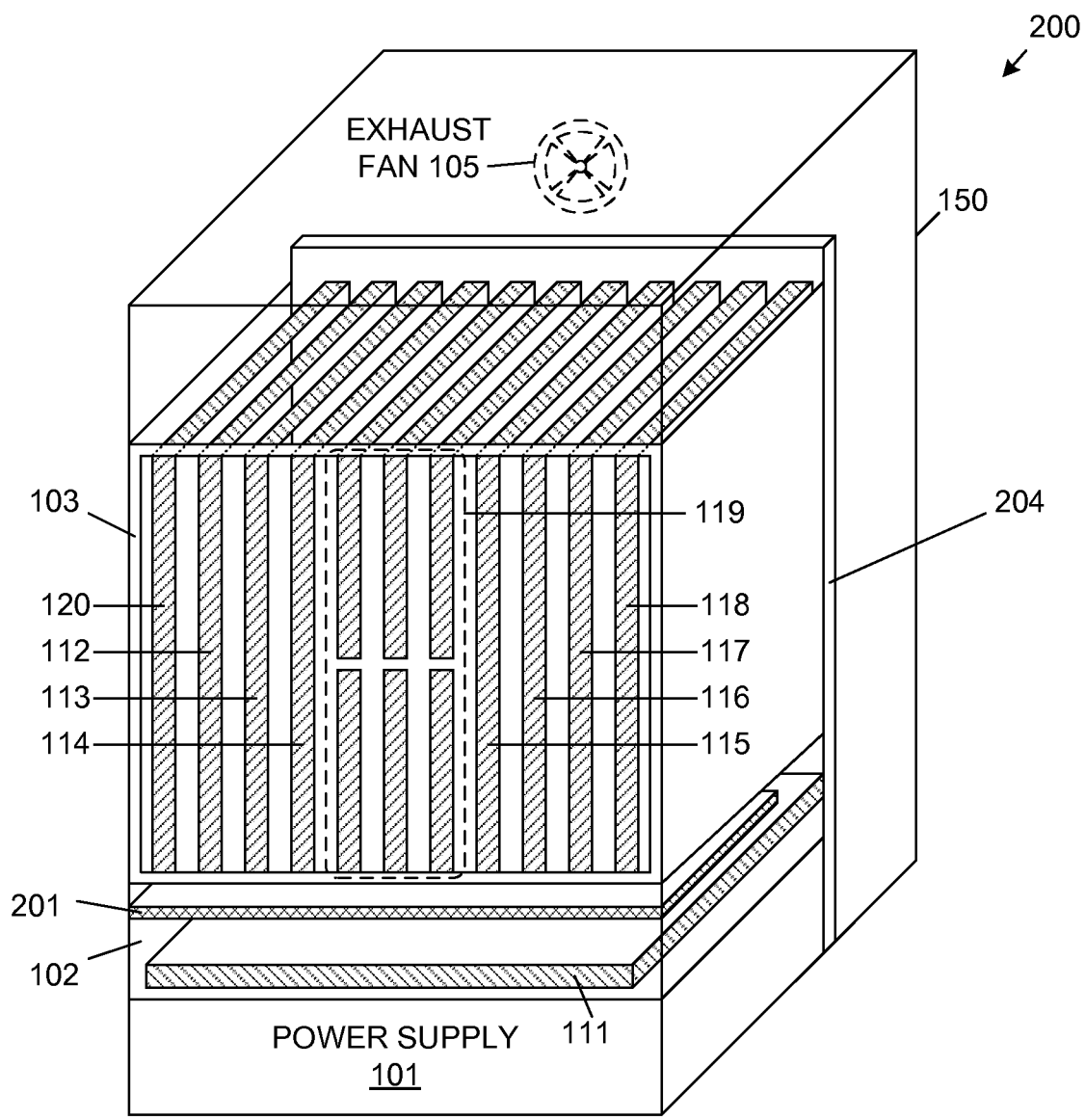
FIG. 2A is an isometric view of a chassis-based processing system in accordance with one embodiment of the present invention.
Figure 2B:
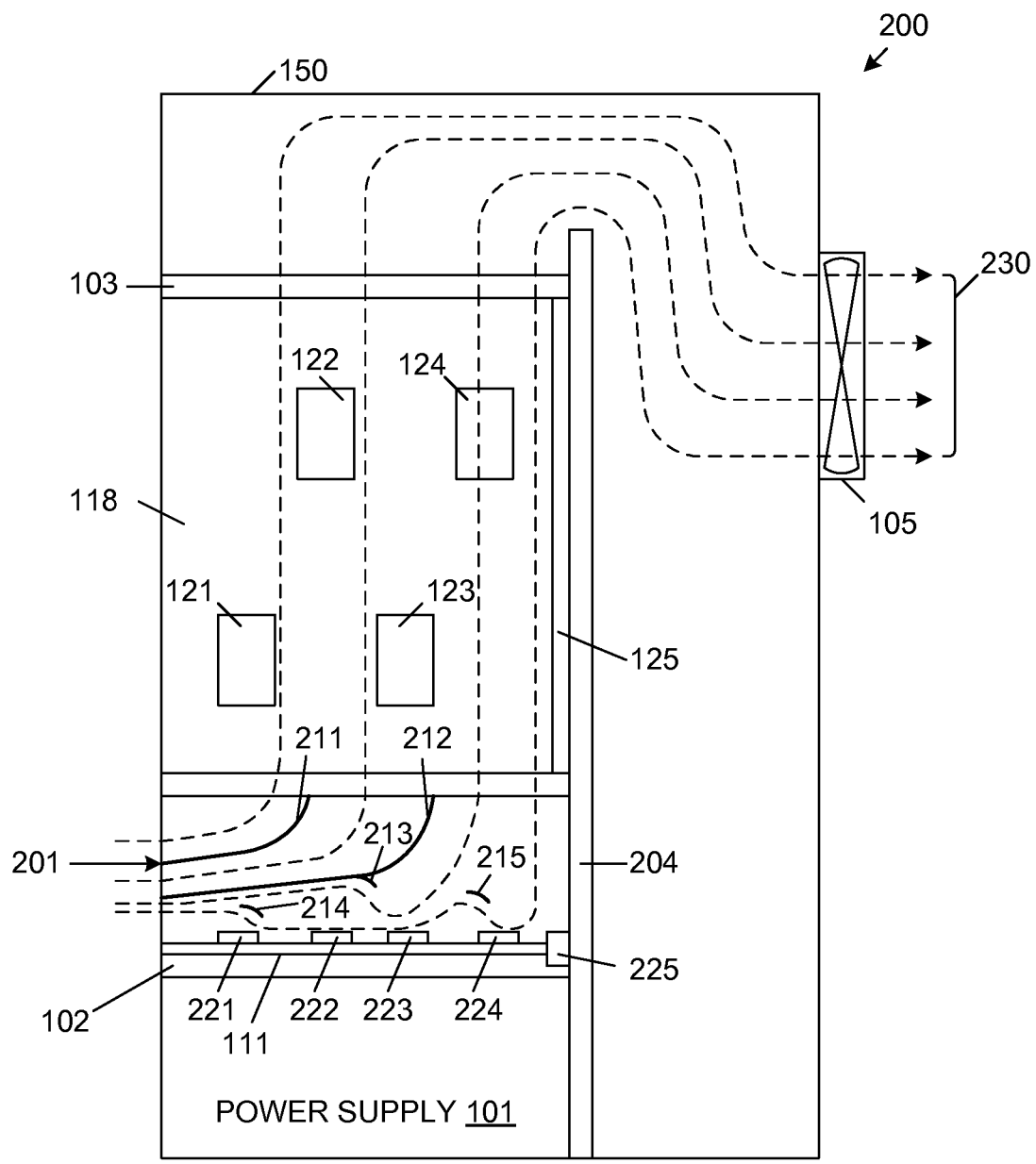
FIG. 2B is a side view of the chassis-based processing system of FIG. 2A in accordance with one embodiment of the present invention.

FIG. 2A is an isometric drawing that represents a chassis-based processing system 200 in accordance with one embodiment of the present invention. FIG. 2B is a side view of chassis-based processing system 200. Because chassis-based processing system 200 includes similar elements as chassis-based processing system 100, similar elements in FIGS. 1A-1B and 2A-2B are labeled with similar reference numbers. Thus, chassis-based processing system 200 includes power supply system 101, air intake plenum 102, card cage 103, exhaust fan 105, processing blades 111-119 and chassis 150. In addition, chassis-based processing system 200 includes backplane 204 (which differs from backplane 104 in a manner described in more detail below), air deflector structure 201, and additional processing blade 120.

As mentioned above, different processing blades can have different physical proximity requirements. Some processing blades, such as those that implement management functions, do not have as demanding a proximity requirement as other processing blades, such as those that implement switching or computational functions. That is, processing blades that implement switching or computational functions must be located physically near one another in order to meet the signaling requirements of these blades. In the described embodiments, processing blade 111 implements management functions of the system 200, while the remaining processing blades 112-120 implement switching or computational functions within system 200, such that processing blade 111 has less demanding proximity requirements than the remaining processing blades 112-120. Note that in chassis-based processing system 100, processing blade 111 (which implements management functions, and therefore has less demanding proximity requirements) is typically located at an end of the card cage 103, adjacent to a side wall of chassis 150.

In accordance with one embodiment of the present invention, one or more processing blades having less demanding proximity requirements are located in the intake plenum 102, rather than in the card cage 103. Thus, in the example illustrated by FIGS. 2A-2B, the processing blade 111, which implements management functions, is located in the intake plenum 102 of chassis-based processing system 200. In the illustrated embodiments, processing blade 111 is located at or near the bottom of intake plenum 102, while card cage 103 located at the top of intake plenum 102. Note that backplane 204 includes a connector element 225 (FIG. 2B) to provide the required connections between processing blade 111 and backplane 204. Guiderails or other alignment devices (not shown) can be included within intake plenum 102 to facilitate the insertion and retention of processing blade 111 within the connector element 225. Locating the processing blade 111 in the intake plenum 102 advantageously allows processing blade 120, which has more demanding proximity requirements than processing blade 111, to be housed within card cage 103 (in parallel with processing blades 112-119). As a result, chassis-based processing system 200 is advantageously able to house more processing blades than chassis-based processing system 100, without significantly increasing the size of the chassis-based processing system.

Because processing blade 111 is positioned perpendicular to processing blades 112-120 within chassis 150, the direction of airflow across processing blade 111 will be different than the relative direction of airflow across processing blades 112-120. In general, the airflow across processing blade 111 would be sub-optimal if no compensation were provided. Thus, in accordance with the present invention, airflow deflector structure 201 is provided to ensure that processing blade 111 is adequately cooled by airflow through intake plenum 102. While FIG. 2A illustrates the general location of airflow deflector structure 201 as an amorphous block, FIG. 2B illustrates actual details of airflow deflector structure 201 in accordance with the present invention. As illustrated in FIG. 2B, electrical components (e.g., integrated circuit chips or devices) 221-224 are located on the upper surface of processing blade 111. Airflow deflector structure 201 includes a first set of upward facing deflectors 211 and 212 which direct incoming airflow upward into card cage 103 (and across parallel processing blades 112-120). Airflow deflector structure 201 also includes downward facing deflectors 213-215, which direct incoming airflow downward onto components 211-224 of processing blade 111. The downward deflected air flows over components 211-214, and then upward through card cage 103. The airflow 230 through chassis 150 is illustrated as dashed lines in FIG. 2B. Deflecting airflow downward onto components 221-224 ensures that these components are adequately cooled, thereby compensating for the less than ideal positioning/configuration of the processing blade 111 within chassis 150.

The number, shape and position of the various downward facing deflectors of air deflector structure 201 can be varied in view of the number, location and heat generating capabilities of the electrical components 221-224 on processing blade 111. Thus, although three downward facing deflectors 213-215 are illustrated in FIG. 2B, it is understood that other numbers of downward facing deflectors can be used in other embodiments. Note that some of the downward facing deflectors, such as deflector 213, may be connected to the underside of an upward facing deflector (e.g., deflector 212), while other downward facing deflectors, such as deflectors 214-215, may be otherwise supported within intake plenum 102 (e.g., connected to the sidewalls of the chassis). The downward facing deflectors 213-215 may extend the full width of chassis 150, or may be narrower than the full width of chassis 150, depending on the cooling requirements of processing blade 111.

Figure 3:
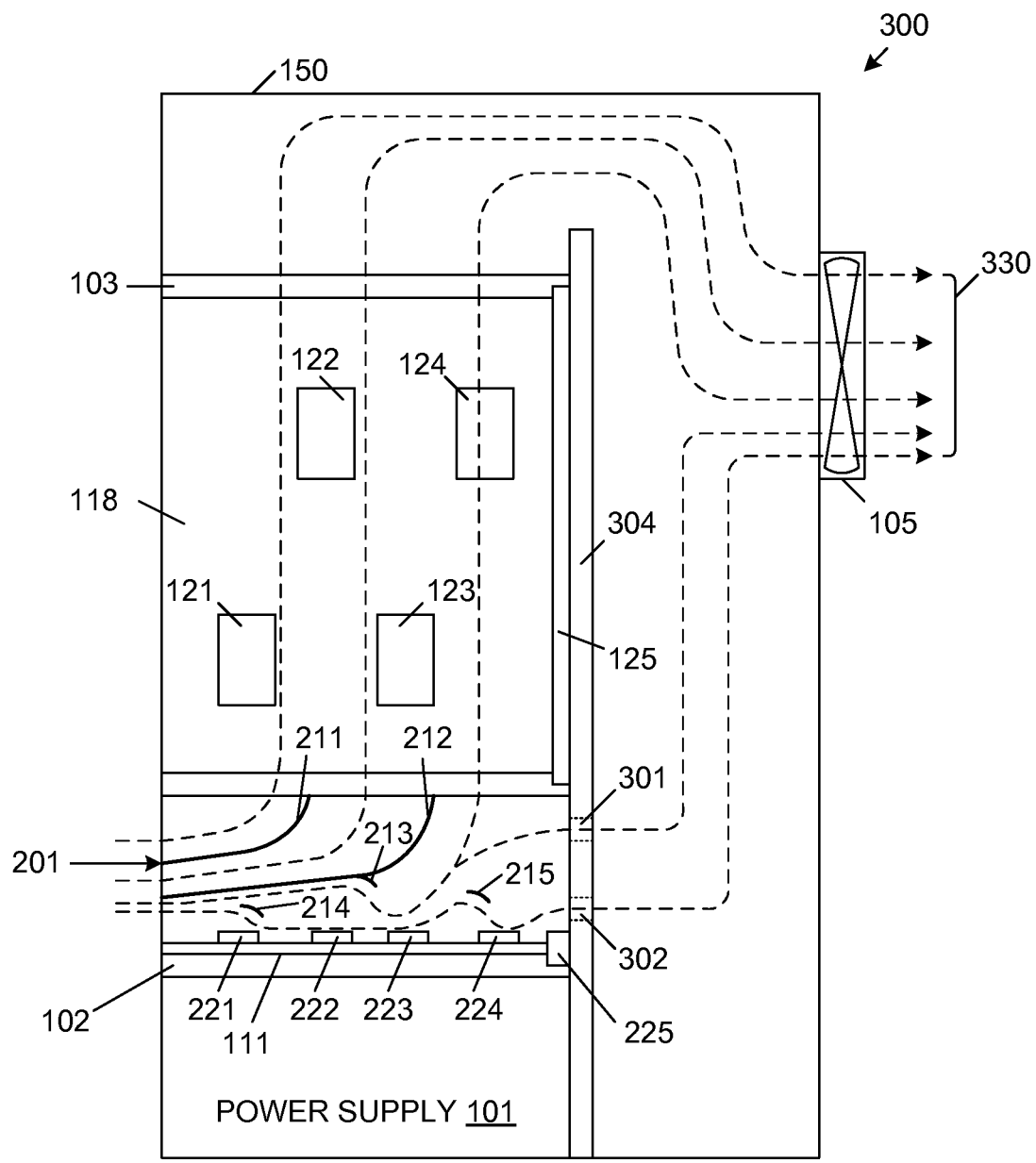
FIG. 3 is a side view of the chassis-based processing system of FIG. 2A in accordance with one variation of the present invention.

FIG. 3 is a side view of a chassis-based processing system 300 in accordance with one variation of the present invention. Because chassis-based processing system 300 substantially similar to chassis-based processing system 200, similar elements in FIGS. 2A-2B and 3 are labeled with similar reference numbers. Chassis-based processing system 300 includes a backplane 304 that includes one or more holes 301-302 formed therein, which creates a slightly modified airflow pattern 330. Holes 301-302 allow some of the downward deflected air to flow through the backplane 304 (after flowing over components 221-224), rather than upward through the card cage 103. These holes 301-302 may improve the cooling capability within chassis 150, because the air heated by flowing over components 211-224 is not routed through card cage 103.

Although the present invention has been described as having the processing blade 111 located in the intake plenum 102, it is understood that it is also possible to locate the processing blade 111 in an exhaust plenum of chassis 150 (i.e., processing blade 111 may be connected to the rear side of backplane 204, and be located within the airflow 230). In this variation, air deflectors (similar to air deflectors 213-215) can be used to ensure adequate airflow over the processing blade 111, in accordance with the above teachings.

Moreover, although the present invention has been described in connection with embodiments that include a single processing blade in the intake plenum 102, it is understood that the present invention could be extended to include more than one processing blade in the intake plenum 102.

Although the present invention has been described in connection with various embodiments, it is understood that variations of these embodiments would be obvious to one of ordinary skill in the art. Thus, the present invention is limited only by the following claims.

I claim:
1. A processing system comprising:
a chassis;
a backplane located within the chassis;
a set of one or more processing blades, each inserted into a corresponding connector element of the backplane, wherein the set of one or more processing blades are positioned in parallel with one another within the chassis;
a plenum that provides an airway from a location external to the chassis to the set of one or more processing blades; and
a first processing blade inserted into a first connector element of the backplane and located in the plenum, wherein electrical components are located on a first surface of the first processing blade, wherein the first surface faces, and is perpendicular to, the set of one or more processing blades, and wherein the airway includes an airflow path that extends from the location external to the chassis, over the electrical components of the first processing blade, to the set of one or more processing blades.

2. The processing system of claim 1, wherein the first processing blade has a first proximity requirement and the set of one or more processing blades have a second proximity requirement, wherein the second proximity requirement is more restrictive the second proximity requirement, such that processing blades in the set of one or more processing blades are required to be located physically nearer to one another other than to the first processing blade.

3. The processing system of claim 1, wherein the first processing blade is located at a first side of the plenum, and the set of one or more processing blades are located at a second side of the plenum, opposite the first side of the plenum.

4. The processing system of claim 1, further comprising an air deflector structure located in the plenum.

5. The processing system of claim 4, wherein the air deflector structure comprises a first set of one or more deflectors positioned to direct airflow onto the first processing blade.

6. The processing system of claim 5, wherein the air deflector structure further comprises a second set of one or more deflectors positioned to direct airflow onto the set of one or more processing blades.

7. The processing system of claim 1, further comprising an air mover coupled to the chassis, wherein the air mover introduces an airflow through the plenum.

8. The processing system of claim 1, wherein the set of one or more processing blades include switching circuitry of a network switch, and the first processing blade includes management logic of the network switch.

9. The processing system of claim 1, further comprising one or more holes that extend through the backplane.

10. The processing system of claim 1, wherein the plenum is located below the set of one or more processing blades in the chassis.

11. A method comprising:
inserting a plurality of processing blades into corresponding connector elements of a backplane, the backplane and the plurality of processing blades within a chassis, wherein the plurality of processing blades are positioned in parallel with one another; and
inserting a first processing blade into a first connector element of the backplane within the chassis, wherein the first processing blade is positioned perpendicular to each of the plurality of processing blades, and wherein the first processing blade is located in a plenum that provides an airflow path that extends from a location external to the chassis, over the first processing blade, to the plurality of processing blades.

12. The method of claim 11, further comprising introducing an airflow over the first processing blade and the plurality of processing blades.

13. The method of claim 12, wherein the step of introducing the airflow comprises:
moving air into the chassis; and
deflecting some of the air moved into the chassis in a first direction toward the first processing blade.

14. The method of claim 13, wherein the step of introducing the airflow further comprises deflecting some of the air moved into the chassis in a second direction toward the plurality of processing blades.

15. The method of claim 12, further comprising introducing an airflow through holes in the backplane.

16. A processing system comprising:
a chassis;
a backplane located within the chassis;
a set of one or more processing blades coupled to the backplane, wherein the set of one or more processing blades are vertically positioned in parallel with one another within the chassis;
a plenum located below the set of one or more processing blades that provides an airway from a location external to the chassis to the set of one or more processing blades;
a first processing blade coupled to the backplane and located in a lower portion of the plenum; and
an air deflector structure located in the plenum, wherein the air deflector structure comprises a first set of one or more deflectors positioned to direct airflow upwards onto the set of one or more processing blades and a second set of one or more deflectors positioned to direct airflow downwards onto the first processing blade.

17. The processing system of claim 16, wherein the first processing blade is positioned perpendicular to the set of one or more processing blades.

18. The processing system of claim 16, wherein the first processing blade has a first proximity requirement and the set of one or more processing blades have a second proximity requirement, wherein the second proximity requirement is more restrictive than the second proximity requirement, such that processing blades in the set of one or more processing blades are required to be located physically nearer to one another other than to the first processing blade.

19. The processing system of claim 16, further comprising an air mover coupled to the chassis, wherein the air mover introduces an airflow through the plenum.

20. The processing system of claim 16, wherein the set of one or more processing blades include switching circuitry of a network switch, and the first processing blade includes management logic of the network switch.

21. The processing system of claim 16, further comprising one or more holes that extend through the backplane.

22. The processing system of claim 21, wherein the one or more holes are adjacent to a location where the first processing blade is coupled to the backplane.

23. A processing system comprising:
a chassis;
a backplane located within the chassis;
a set of one or more processing blades coupled to the backplane, wherein the set of one or more processing blades are positioned in parallel with one another within the chassis;
a plenum that provides an airway from a location external to the chassis to the set of one or more processing blades;
a first processing blade coupled to the backplane and located in the plenum; and
an air deflector structure located in the plenum, the air deflector structure including a first set of one or more deflectors positioned to direct airflow in a first direction onto the first processing blade and a second set of one or more deflectors positioned to direct airflow in a second direction onto the set of one or more processing blades, wherein the second direction is opposite the first direction.

24. A method comprising:
coupling a plurality of processing blades to a backplane, the backplane and the plurality of processing blades within a chassis, wherein the plurality of processing blades are vertically positioned in parallel with one another;
positioning a plenum within the chassis located below the plurality of processing blades, the plenum provides an airway from a location external to the chassis to the plurality of processing blades;
coupling a first processing blade to the backplane, the first processing blade located in a lower portion of the plenum;
moving air into the plenum;
deflecting a first portion of the air moved into the plenum in an upwards direction toward the plurality of processing blades; and
deflecting a second portion of the air moved into the plenum in a downwards direction toward the first processing blade, wherein the first processing blade is positioned perpendicular to each of the plurality of processing blades.

25. The method of claim 24, further comprising introducing an airflow through holes in the backplane.

26. A method comprising:
coupling a plurality of processing blades to a backplane, the backplane and the plurality of processing blades within a chassis, wherein the plurality of processing blades are positioned in parallel with one another; and
coupling a first processing blade to the backplane within the chassis, wherein the first processing blade is positioned perpendicular to each of the plurality of processing blades; and
introducing an airflow over the first processing blade and the plurality of processing blades, wherein the step of introducing the airflow comprises:
moving air into the chassis;
deflecting some of the air moved into the chassis in a first direction toward the first processing blade; and
deflecting some of the air moved into the chassis in a second direction toward the plurality of processing blades, wherein the first direction is opposite the second direction.

27. A processing system comprising:
a chassis;
a backplane located within the chassis, wherein one or more holes extend through the backplane;
a set of one or more processing blades coupled to the backplane, wherein the set of one or more processing blades are positioned in parallel with one another within the chassis;
a plenum that provides an airway from a location external to the chassis to the set of one or more processing blades; and
a first processing blade coupled to the backplane and located in the plenum, wherein the one or more holes are adjacent to a location where the first processing blade is coupled to the backplane.

* * * * *